United States Patent
Feng et al.

(10) Patent No.: US 8,053,790 B2
(45) Date of Patent: Nov. 8, 2011

(54) OPTICAL DEVICE HAVING LIGHT SENSOR EMPLOYING HORIZONTAL ELECTRICAL FIELD

(75) Inventors: Dazeng Feng, Arcadia, CA (US); Po Dong, Arcadia, CA (US); Mehdi Asghari, San Marino, CA (US); Ning-Ning Feng, Arcadia, CA (US)

(73) Assignee: Kotusa, Inc., Monterey Park, CA (US)

( * ) Notice: Subject to any disclaimer, the term of this patent is extended or adjusted under 35 U.S.C. 154(b) by 300 days.

(21) Appl. No.: 12/380,016

(22) Filed: Feb. 19, 2009

(65) Prior Publication Data
US 2010/0207223 A1    Aug. 19, 2010

(51) Int. Cl.
*H01L 21/00* (2006.01)
(52) U.S. Cl. .................... 257/85; 257/E31.032
(58) Field of Classification Search ............. 257/85, 257/E31.032; 438/28–31
See application file for complete search history.

(56) References Cited

U.S. PATENT DOCUMENTS

| | | | |
|---|---|---|---|
| 3,242,805 A | | 3/1966 | Harrick |
| 3,753,157 A | * | 8/1973 | Ash et al. ..................... 333/101 |
| 4,784,452 A | | 11/1988 | Hodge |
| 4,923,264 A | * | 5/1990 | Langer et al. ..................... 385/2 |
| 5,159,700 A | | 10/1992 | Reid |
| 5,448,536 A | * | 9/1995 | Muranishi et al. ......... 369/13.28 |
| 5,642,371 A | * | 6/1997 | Tohyama et al. .......... 372/45.01 |
| 5,963,358 A | * | 10/1999 | Shields ......................... 359/248 |
| 6,114,088 A | * | 9/2000 | Wolk et al. ................. 430/273.1 |
| 6,924,510 B2 | | 8/2005 | Gardner |
| 7,120,350 B2 | | 10/2006 | Block et al. |
| 7,308,166 B1 | | 12/2007 | Peng |
| 7,339,724 B2 | * | 3/2008 | Hochberg et al. ............. 359/335 |
| 7,643,714 B2 | * | 1/2010 | Hochberg et al. ............. 385/122 |
| 2002/0181067 A1 | * | 12/2002 | Romanovsky et al. ....... 359/245 |
| 2002/0191916 A1 | | 12/2002 | Frish |
| 2003/0016896 A1 | * | 1/2003 | Azarbar et al. .................... 385/2 |
| 2005/0018276 A1 | * | 1/2005 | Kourogi et al. ............... 359/333 |
| 2008/0272391 A1 | | 11/2008 | Kapur et al. |
| 2009/0022452 A1 | * | 1/2009 | Welch et al. ..................... 385/14 |

OTHER PUBLICATIONS

D. Ahn, C-Y. Hong, J. Liu, W. Giziewics, M. Beals, L. C. Kimerling, and J. Michel, *High performance, waveguide integrated Ge photodetectors*, Opt. Express, 15, 3916 (2007).

Jutzi et al., *Ge-on-So vertical incidence Photodiodes with 39-GHz Bandwidth*, IEEE Photonics TechnologyLetters, vol. 17, No. 7, Jul. 2005 (pp. 1510-1512).

Liu et al., *Tensile strained Ge p-l-n photodetectors on Si platform for C and L band telecommunications*, Appl. Phys. Lett. 87, 011110 (2005) (pp. 1-3).

Rouviere et al., *Integration of germanium waveguide photodetectors for intrachip optical interconnects*, Optical Engineering 44(7), 075402 (Jul. 2005) (pp. 1-5).

Vivien et al., *High speed and high responsivity germanium photodetector integrated in a Silicon-On-Insulator microwaveguide*, Jul. 23, 2007/ vol. 15, No. 15/Optics Express (pp. 9843-9845).

(Continued)

*Primary Examiner* — Michael S Lebentritt
(74) *Attorney, Agent, or Firm* — Gavrilovich, Dodd & Lindsey, LLP

(57) ABSTRACT

The optical device includes a waveguide and a light sensor on a base. The light sensor includes a light-absorbing medium configured to receive a light signal from the waveguide. The light sensor also includes field sources for generating an electrical field in the light-absorbing medium. The field sources are configured so the electrical field is substantially parallel to the base.

20 Claims, 11 Drawing Sheets

OTHER PUBLICATIONS

L. Vivien, J. Osmond, J.-M. Fedeli, D. Marris-Morini, P. Crozat, J.-F. Damlencourt, E. Cassan, Y. Lecunff, S. Laval, *42 GHz p.i.n Germanium photodetector integrated in a silicon-on-inculator waveguide*, Opt. Express 17, 6252 (2008).

J. Wang, W. Y. Loh, K. T. Chua, H. Zang, Y. Z. Xiong, S. M. F. Tan, M. B. Yu, S. J. Lee, G. Q. Lo, and D. L. Kwong, *Low-voltage high-speed (18GHz/1V) evanescent-coupled thin-file-Ge lateral PIN photodetectors integrated on Si waveguide*, IEEE Photon. Technol. Lett., 17, 1485 (2008).

Yin et al., *31GHz Ge n-I-p waveguide photodetectors on Sililcon-on-Insulator substrate*, Oct. 17, 2007/Vpl. 15, No. 21/Optics Express (pp. 13965-13971).

International Search Report and Written Opinion of the International Search Authority as extracted from PCT/US10/000367.

D. Ahn, C-Y. Hong, J. Liu, W. Giziewics, M. Beals, L. C. Kimerling, and J. Michel, "High performance, waveguide integrated Ge photodetectors," Opt. Express, 15, 3916 (2007).

L. Vivien, J. Osmond, J.-M. Fedeli, D. Marris-Morini, P. Crozat, J.-F. Damlencourt, E. Cassan, Y. Lecunff, S. Laval, "42 GHz p. i.n Germanium photodetector integrated in a silicon-oninculator waveguide," Opt. Express 17, 6252 (2008).

J. Wang, W. Y. Loh, K. T. Chua, H. Zang, Y. Z. Xiong, S. M. F. Tan, M. B. Yu, S. J. Lee, G. Q. Lo, and D. L. Kwong, "Low-voltage high-speed (18GHz/IV) evanescent-coupled thin-file-Ge lateral PIN photodetectors integrated on Si waveguide," IEEE Photon. Technol. Lett., 17, 1485 (2008).

T. Yin, R. Cohen, M. Morse, G. Sarid, Y. Chetrit, D. Rubin, and M. Paniccia, "31 GHz Ge n-i-p waveguide photodetectors on Silicon-on-insulator substrate," Opt. Express, 15, 13965 (2007).

\* cited by examiner

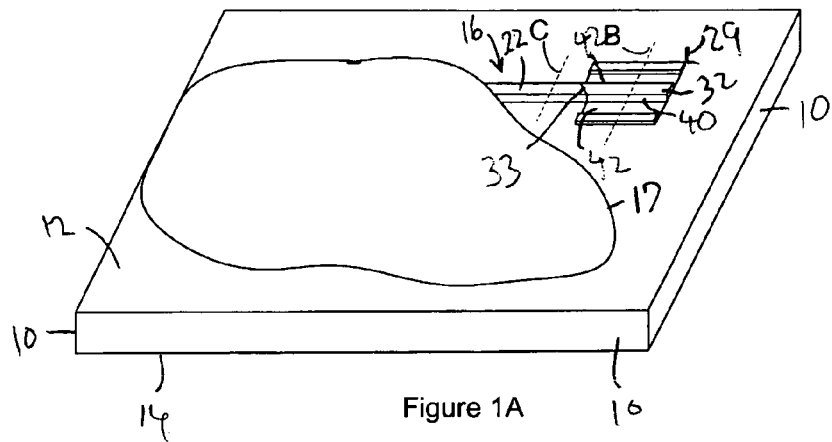
Figure 1A
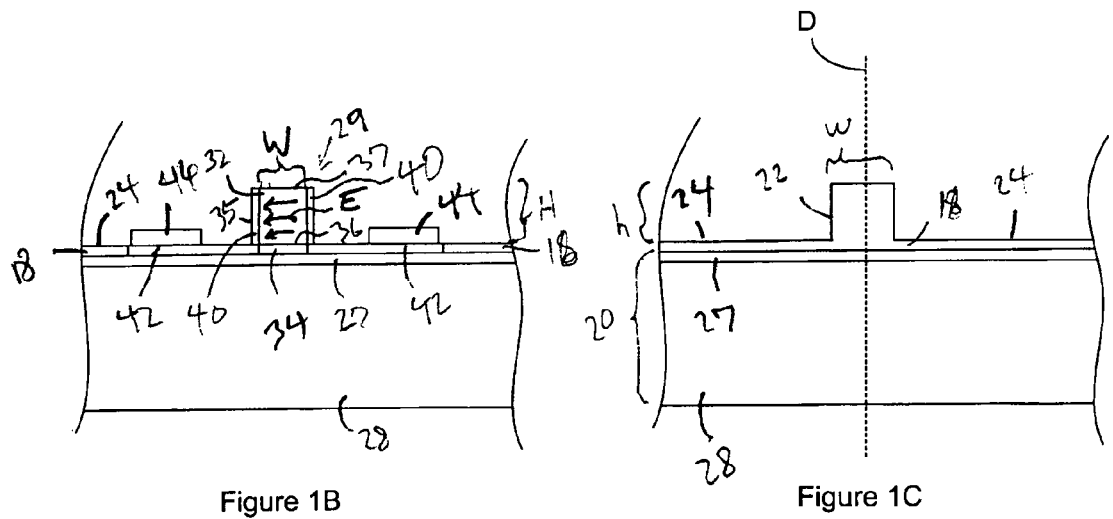
Figure 1B
Figure 1C
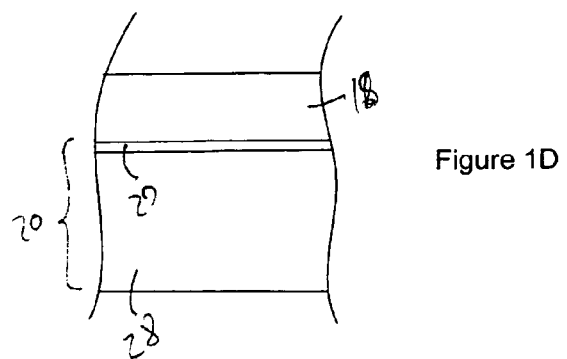
Figure 1D

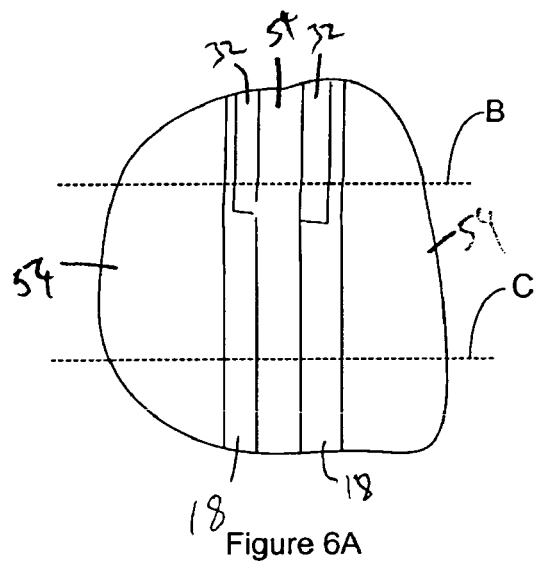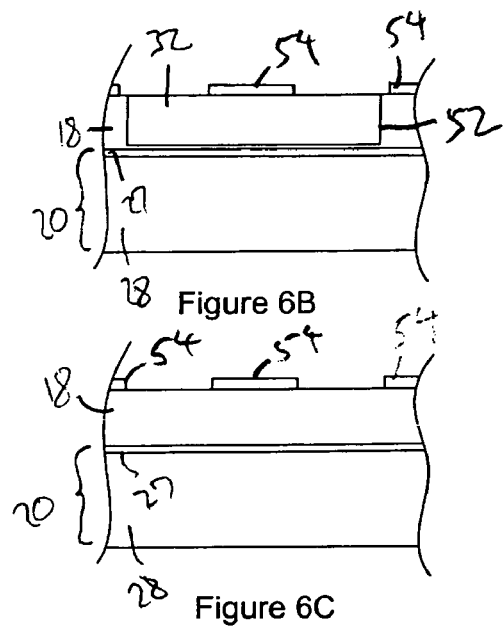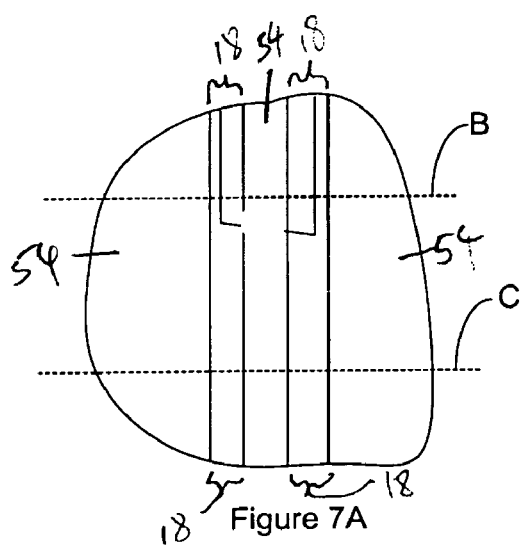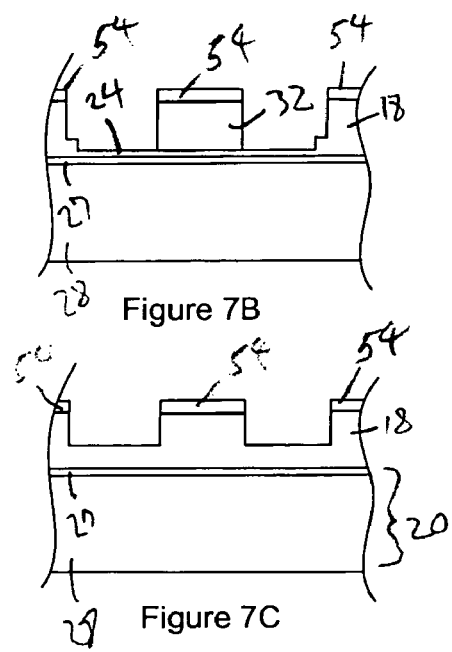

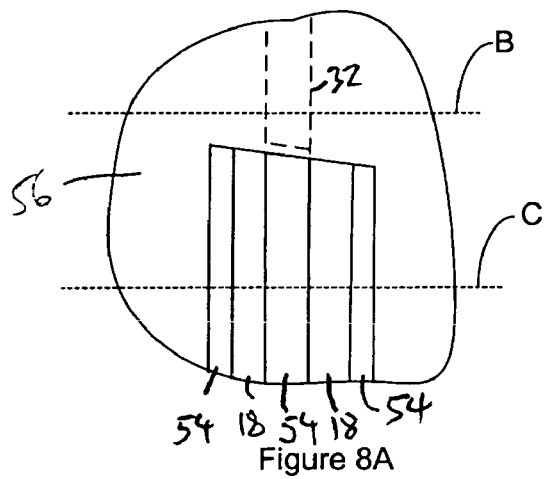
Figure 8A
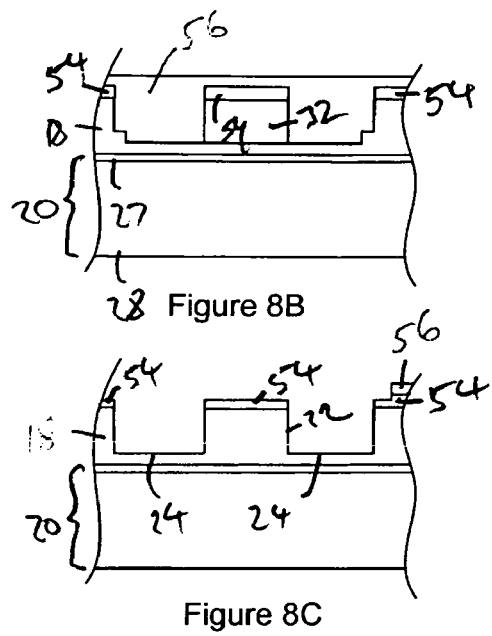
Figure 8B
Figure 8C
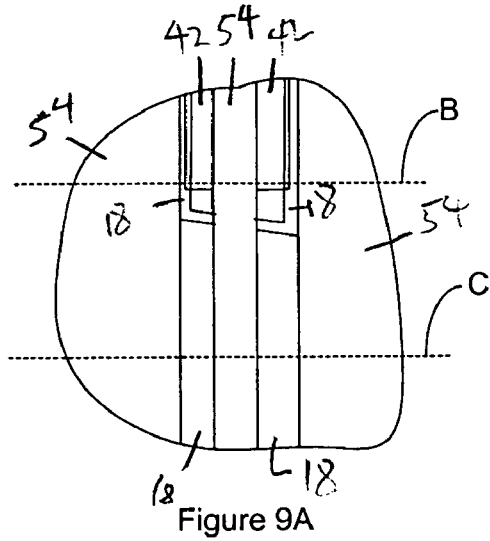
Figure 9A
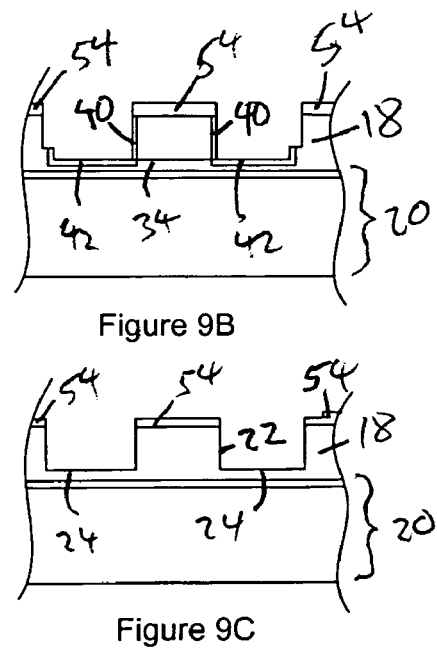
Figure 9B
Figure 9C

OPTICAL DEVICE HAVING LIGHT SENSOR EMPLOYING HORIZONTAL ELECTRICAL FIELD

FIELD

The present invention relates to optical devices and more particularly to devices having a light sensor.

BACKGROUND

The use of optical and/or optoelectronic devices is increasing in communications applications. These devices can include light sensors that receive light signals from a waveguide. These light sensors often employ a light-absorbing material that absorbs the received light signals. During operation of the light sensor, an electrical field is applied across the light-absorbing material. When the light-absorbing material absorbs a light signal, an electrical current flows through the light-absorbing material. As a result, the level of electrical current through the light-absorbing material indicates the intensity of light signals being received by the light-absorbing material.

The waveguides on optical and/or optoelectronic devices are often made of silicon. Because silicon does not absorb the light signals having the wavelengths that are used in communications applications, silicon is often not effective for use as the light-absorbing medium in the light sensors for communications application. In contrast, germanium is a material that can absorb these light signals and is accordingly often used as the light-absorbing medium in the light sensors for communications application.

These light sensors have been able to achieve adequate speeds when the waveguides have a cross-section with submicron dimensions. However, these light sensors are associated with undesirably high optical loss when used with waveguides having these dimensions. Further, the waveguides used in many communications applications employ larger waveguides. When these light sensors are used with larger waveguides, they generally lose speed and become associated with undesirable levels of dark current.

For the above reasons, there is a need for light sensors that are suitable for use with larger waveguides.

SUMMARY

An optical device includes a waveguide on a base. The device also includes a light sensor on the base. The light sensor includes a light-absorbing medium configured to receive a light signal from the waveguide. The light sensor also includes field sources for generating an electrical field in the light-absorbing medium. The field sources are configured so the electrical field is substantially parallel to the base.

In one embodiment of the optical device, the waveguide is configured to guide a light signal through a light-transmitting medium. Additionally, the light-absorbing medium has lateral sides that are each positioned between a top side and a bottom side with the bottom side being between the base and the top side. The light-absorbing medium is configured to receive at least a portion of the light signal from the light-transmitting medium in the waveguide. The light-transmitting medium and the light-absorbing medium are different materials. The light sensor also includes field sources configured to serve as sources of an electrical field in the light-absorbing medium. The field sources each contact one of the lateral sides and the lateral sides that are contacted by the field sources are on opposing sides of the light-absorbing medium.

BRIEF DESCRIPTION OF THE FIGURES

FIG. 1A through FIG. 1D illustrate an optical device having a light sensor configured to receive light signals from a waveguide. The light sensor includes field sources that are configured to generate a substantially horizontal electrical field in a light-absorbing medium. The device illustrated in FIG. 1A through FIG. 1D employs doped regions of the light-absorbing medium as the field sources. FIG. 1A is a perspective view of the device.

FIG. 1B is a cross-section of the device shown in FIG. 1A taken along the line labeled B.

FIG. 1C is a cross-section of the device shown in FIG. 1A taken along the line labeled C.

FIG. 1D is a cross-section of the optical device shown in FIG. 1C taken along the line labeled C and extending parallel to the longitudinal axis of the waveguide.

FIG. 4A through FIG. 12C illustrate a method of generating an optical device constructed according to FIG. 1A through FIG. 1C.

DESCRIPTION

Figure 2A:
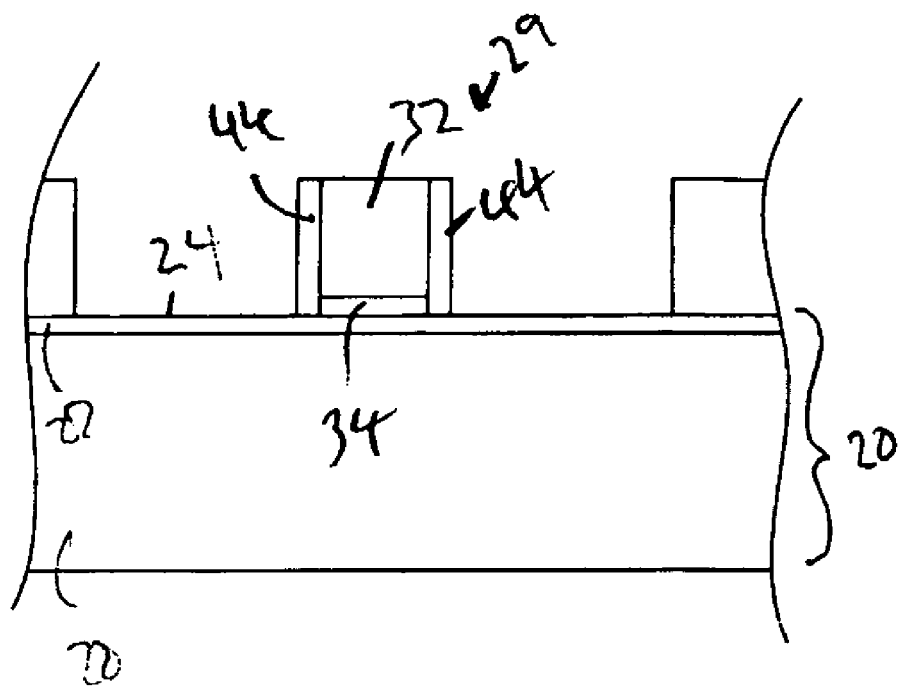
FIG. 2A is a cross-section of a light sensor that employs electrical conductors as field sources.

The optical device includes a light-transmitting medium on a base. The device also includes a waveguide configured to guide a light signal through the light-transmitting medium. The optical device also includes a light sensor configured to receive the light signal from the waveguide. The light sensor includes a light-absorbing medium positioned such that a seed portion of the light-transmitting medium is between the light-absorbing medium and the base. The light-absorbing medium can be grown on the seed portion of the light-transmitting medium.

The light sensor includes field sources in contact with the light-absorbing medium. During operation of the light sensor, the field sources are employed to form an electrical field in the light-absorbing medium. The field sources are arranged such that the resulting electrical field is substantially parallel to the base or is substantially horizontal. For instance, the field sources can be positioned on the lateral sides of the light-absorbing medium. Since the electrical field is substantially parallel to the base, the electrical field is also substantially parallel to an interface between the seed portion of the light-transmitting medium and the light-absorbing medium. The interaction between the electrical field and this interface is a source of dark current in the light sensor. As a result, forming the electrical field parallel to this interface reduces dark current in the light sensor.

Additionally, the width of the waveguide can be tapered before the light signal enters the light-absorbing medium. As a result, the light-absorbing medium can have a width that is smaller than the width of the waveguide. The reduced width increases the speed of the light sensor. Accordingly, even when used with waveguide sizes that are common in communications applications, the light sensor can have desirable levels of speed and dark current while also having the reduced optical loss associated with light sensors built on larger waveguides.

FIG. 1A through FIG. 1D illustrate an optical device having a light sensor configured to receive light signals from a waveguide. FIG. 1A is a perspective view of the device. FIG. 1B is a cross-section of the light sensor. For instance, FIG. 1B is a cross-section of the device shown in FIG. 1A taken along the line labeled B. FIG. 1C is a cross-section of the waveguide. For instance, FIG. 1C is a cross-section of the device shown in FIG. 1A taken along the line labeled C. FIG. 1D is a cross-section of the optical device shown in FIG. 1C taken along the line labeled C and extending parallel to the longitudinal axis of the waveguide.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extends through the lateral sides 10 of the device. The top side 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, light sensors that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

The waveguide 16 is defined in a light-transmitting medium 18 positioned on a base 20. For instance, the waveguide 16 is partially defined by a ridge 22 defined by trenches 24 extending partially into the light-transmitting medium 18 or through the light-transmitting medium 18. Suitable light-transmitting media include, but are not limited to, silicon, polymers, silica, SiN, GaAs, InP and $LiNbO_3$. One or more cladding layers are optionally positioned on the light-transmitting medium. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and $LiNbO_3$.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 27 with a lower index of refraction than the light-transmitting medium 18. The drop in the index of refraction can cause reflection of a light signal from the light-transmitting medium 18 back into the light-transmitting medium 18. The base 20 can include the optical insulator 27 positioned on a substrate 28. As will become evident below, the substrate 28 can be configured to transmit light signals. For instance, the substrate 28 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the optical insulator 27 and the silicon substrate can serve as the substrate 28.

The optical device also includes a light sensor 29 configured to receive a light signal guided by the one or more waveguides 16. The light sensor 29 is configured to convert the light signal to an electrical signal. Accordingly, the light signal can be employed to detect receipt of light signals. For instance, the light sensor 29 can be employed to measure the intensity of a light signal and/or power of a light signal. Although FIG. 1A illustrates a waveguide 16 carrying the light signal between the one or more components and the light sensor 29, the device can be constructed such that the waveguide 16 carries the light signal directly from an optical fiber to the light sensor 29.

A suitable light sensor 29 includes a light-absorbing medium 32 that absorbs light signals. The light-absorbing medium 32 is positioned to receive at least a portion of a light signal traveling along the waveguide 16. As is evident from FIG. 1A, there is an interface between a facet of the light-absorbing medium 32 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The light-absorbing medium 32 of the light sensor 29 is positioned on a seed portion 34 of the light-transmitting medium 18. The seed portion 34 of the light-transmitting medium 18 is positioned on the base 20. In particular, the seed portion 34 of the light-transmitting medium 18 contacts the insulator 27. The seed portion 34 of the light-transmitting medium 18 can be continuous with the light-transmitting medium 18 included in the waveguide 16 or spaced apart from the waveguide 16. When the light signal enters the light sensor, a portion of the light signal can enter the seed portion 34 of the light-transmitting medium 18 and another portion of the light signal enters the light-absorbing medium 32. Accordingly, the light-absorbing medium 32 can receive only a portion of the light signal. In some instances, the light sensor can be configured such that the light-absorbing material receives the entire light signal.

During the fabrication of the device, the seed portion 34 of the light-transmitting medium 18 can be used to grow the light-absorbing medium 32. For instance, when the light-transmitting medium 18 is silicon and the light-absorbing medium 32 is germanium, the germanium can be grown on the silicon. As a result, the use of the light-transmitting medium 18 in both the waveguides 16 and as a seed layer for growth of the light-absorbing medium 32 can simplify the process for fabricating the device.

During operation of the light sensor 29, a reverse bias electrical field is applied across the light-absorbing medium 32. When the light-absorbing medium 32 absorbs a light signal, an electrical current flows through the light-absorbing medium 32. As a result, the level of electrical current through the light-absorbing medium 32 indicates receipt of a light signal. Additionally, the magnitude of the current can indicate the power and/or intensity of the light signal. Different light-absorbing medium 32 can absorb different wavelengths and are accordingly suitable for use in a sensor 29 depending on the function of the sensor 29. A light-absorbing medium 32 that is suitable for detection of light signals used in communications applications includes, but are not limited to, germanium, silicon germanium, silicon germanium quantum well, GaAs, and InP. Germanium is suitable for detection of light signals having wavelengths in a range of 1300 nm to 1600 nm.

The light sensor can be configured to apply an electric field to the light-absorbing medium 32 that is substantially parallel to the base 20. For instance, the light-absorbing medium 32 can include lateral sides 35 that connect a bottom side 36 and a top side 37. The bottom side is located between the top side and the base 20. In some instances, the lateral sides are substantially perpendicular relative to the base 20.

The lateral sides of the light-absorbing medium 32 can include doped regions 40. As is evident from FIG. 1B, each of the doped regions 40 can extend up to the top side of the light-absorbing medium 32. Each of the doped regions 40 can be an N-type doped regions or a P-type doped region. For instance, each of the N-type doped regions can include an N-type dopant and each of the P-type doped regions can include a P-type dopant. In some instances, the light-absorbing medium 32 includes a doped region 40 that is an N-type doped region and a doped region 40 that is a P-type doped region. The separation between the doped regions 40 in the light-absorbing medium 32 results in the formation of PIN (p-type region-insulator-n-type region) junction in the light sensor 29.

In the light-absorbing medium 32, suitable dopants for N-type regions include, but are not limited to, phosphorus and/or arsenic. Suitable dopants for P-type regions include, but are not limited to, boron. The doped regions 40 are doped so as to be electrically conducting. A suitable concentration for the P-type dopant in a P-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

The light-transmitting medium 18 also includes doped regions 42. Each doped region 42 in the light-transmitting medium 18 contacts one of the doped regions 40 in the light-absorbing medium 32. A doped region 42 in the light-transmitting medium 18 and the contacted doped region 40 are the same type of doped region. For instance, when a doped region 40 in the light-absorbing medium 32 is a P-type region, that doped region 40 contacts a P-type doped region in the light-transmitting medium 18. As a result, in some instances, one of the doped regions 42 in the light-transmitting medium 18 is a P-type doped region and one of the doped regions 42 in the light-transmitting medium 18 is an N-type doped region.

In the light-transmitting medium 18, suitable dopants for N-type regions include, but are not limited to, phosphorus and/or arsenic. Suitable dopants for P-type regions include, but are not limited to, boron. The doped regions 42 are doped so as to be electrically conducting. A suitable concentration for the P-type dopant in a P-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

Each doped region 42 in the light-transmitting medium 18 is in contact with an electrical conductor 44 such as a metal. Accordingly, the each of the doped regions 42 in the light-transmitting medium 18 provides electrical communication between an electrical conductor 44 and one of the doped regions 40 in the light-absorbing medium 32. As a result, electrical energy can be applied to the electrical conductors 44 in order to apply the electric field to the light-absorbing medium 32. As is evident from the arrows labeled E in FIG. 1B, the doped regions 40 in the light-absorbing medium 32 serve as the field sources for the electrical field. As a result, the resulting electrical field is substantially parallel to the base 20.

Rather than using doped regions 40 in the light-absorbing medium 32 as the field sources, electrical conductors 44 such as metal can be used as the field sources. For instance, FIG. 2A is a cross-section of a light sensor that employs electrical conductors 44 as field sources. The electrical conductors 44 extend from the base 20 to the top side of the light-absorbing medium 32. For instance, FIG. 2A illustrates the electrical conductors 44 extending from the insulator 27 to the top side of the light-absorbing medium 32. The seed portion 34 of the light-transmitting medium 18 is between the base 20 and the light-absorbing medium 32.

Figure 2B:
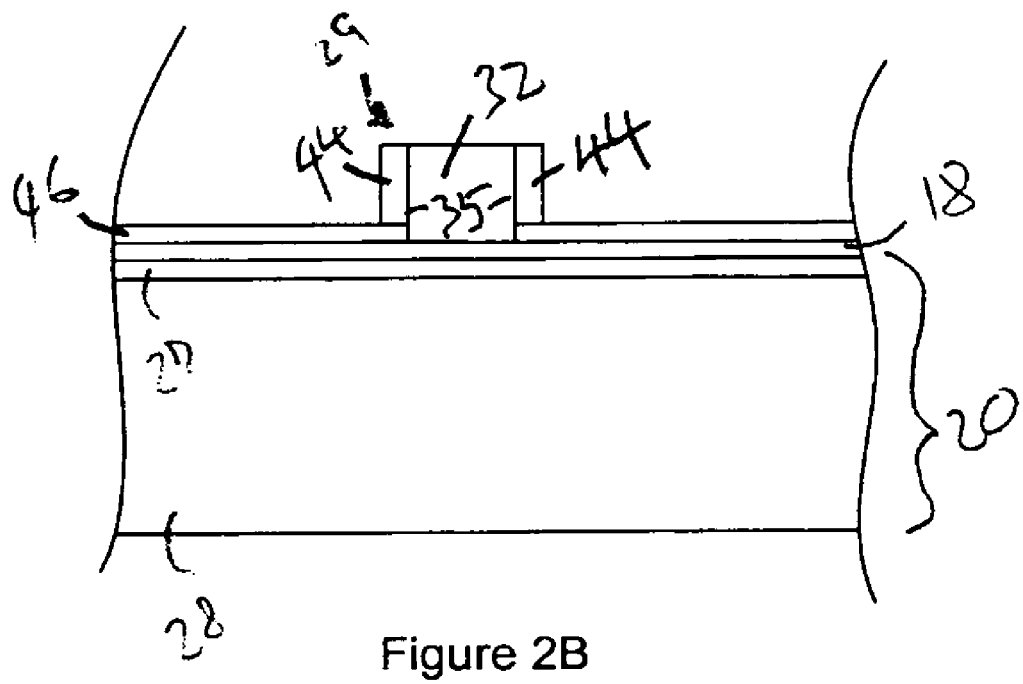
FIG. 2B is a cross-section of a light sensor that employs electrical conductors as field sources. The electrical conductors are elevated above the height of the electrical conductors shown in FIG. 2A.

As is evident from FIG. 2A, the electrical conductors 44 can contact the base 20. However, the electrical conductors 44 can be spaced apart from the base 20 as illustrated in FIG. 2B. In FIG. 2B, a spacer layer 46 is formed on top of the light-transmitting medium 18 and against the lateral sides of the light-absorbing medium 32. The electrical conductors 44 extend from the top of the spacer layer 46 to the top side of the light-absorbing medium 32. As a result, the spacer layer 46 elevates the bottom of the electrical conductors 44 relative to the base 20. The electrical conductors 44 are also elevated above the interface between the light-absorbing medium 32 and the seed portion 34 of the light-transmitting medium 18. The elevation of the electrical conductors 44 reduces interaction between the resulting electrical field and the interface between the light-absorbing medium 32 and the seed portion 34 of the light-transmitting medium 18. This reduced interaction further reduces the level of dark current associated with the light sensor.

Increasing the portion of the lateral side that is contacted by the field source can increase the efficiency of the light sensor. Accordingly, as is evident in FIG. 1A and FIG. 2A, each of the field sources can span the distance between the top of the lateral side contacted by the field source and the bottom of the lateral side contacted by the field source. In some instances, each of the field sources extends from the top of the lateral side contacted by the field source toward the base 20. Alternately, each of the field sources can extend toward the base 20 from a location that is above 90% of a distance between the top of the lateral side contacted by the field source and the bottom of the lateral side contacted by the field source. Each of the field sources can extend toward the base 20 from a location that is above 80% of a distance between the top of the lateral side contacted by the field source and the bottom of the lateral side contacted by the field source. In one example, each of the field sources extends toward the base 20 from a location that is within 1.0 μm of a top of the lateral side contacted by that field source.

As noted above, the light sensor is suitable for use with waveguide dimensions that are suitable for use in communications applications. Accordingly, a suitable height for the waveguide 16 (labeled h in FIG. 1C) includes, but is not limited to, heights greater than 1 μm, 2 μm, and 3 μm. A suitable width for the waveguide 16 (labeled w in FIG. 1C) includes, but is not limited to, widths greater than 0.5 μm, 2 μm, and 3 μm. Suitable waveguide dimension ratios (width of the waveguide 16: height of the waveguide 16) include, but are not limited to, ratios greater than 0.15:1, 0.5:1, and 1:1 and/or less that 0.25:1, 1:1, and 2:1.

The increased dimensions of the waveguide 16 are also associated with increased dimensions of the light-absorbing medium 32. For instance, a suitable height for the light-absorbing medium 32 (labeled H in FIG. 1B) includes, but is not limited to, heights greater than 1 μm, 2 μm, and 3 μm. A suitable width for the light-absorbing medium 32 (labeled W in FIG. 1B) includes, but is not limited to, widths greater than 0.5 μm, 1.5 μm, and 2 μm. Suitable light-absorbing medium 32 dimension ratios (width of the waveguide 16: height of the waveguide 16) include, but are not limited to, ratios greater than 0.15:1, 0.5:1, and 0.75:1 and/or less than 0.25:1, 0.75:1, and 1:1.

Figure 3:
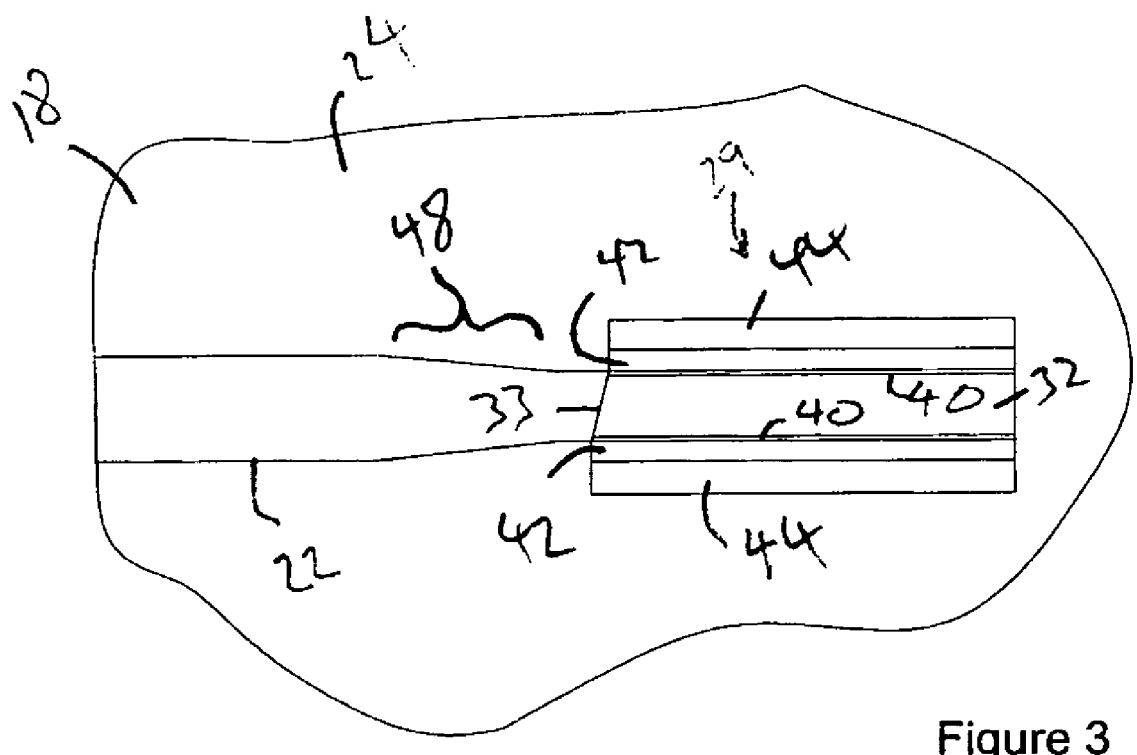
FIG. 3 is a topview of an optical device where the waveguide includes a horizontal taper.

FIG. 3 is a topview of an optical device where the waveguide 16 includes a taper 48. The taper 48 can be a horizontal taper and need not include a vertical taper although a vertical taper is optional. The taper 48 is positioned before the light sensor. For instance, the horizontal taper occurs in the light-transmitting medium 18 rather than in the light-absorbing medium 32. The taper 48 allows the light-absorbing medium 32 to have a narrower width than the waveguide 16. The reduced width of the light-absorbing medium 32 increases the speed of the light sensor. The optical component preferably excludes additional components between the taper and light sensor although other components may be present.

The optical device can be constructed using fabrication technologies that are employed in the fabrication of integrated circuits, optoelectronic circuits, and/or optical devices. For instance, the ridge 22 for the waveguide 16 and/or the seed portion 34 can be formed in the light-transmitting medium 18 using etching technologies on a silicon-on-insulator wafer. Horizontal tapers can be readily formed using masking and etching technologies. Suitable methods for forming vertical tapers are disclosed in U.S. patent application Ser. No. 10/345,709, filed on Jan. 15, 2003, entitled "Controlled Selectivity Etch for Use with Optical Component Fabrication," and incorporated herein in its entirety.

FIG. 4A through FIG. 12C illustrate a method of generating an optical device constructed according to FIG. 1A through FIG. 1C. The method is illustrated using a silicon-on-insulator wafer or chip as the starting precursor for the optical device. However, the method can be adapted to platforms other than the silicon-on-insulator platform.

Figure 4A:
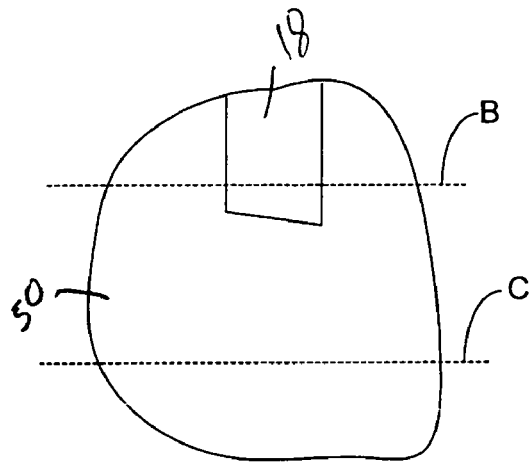
Figure 4B:
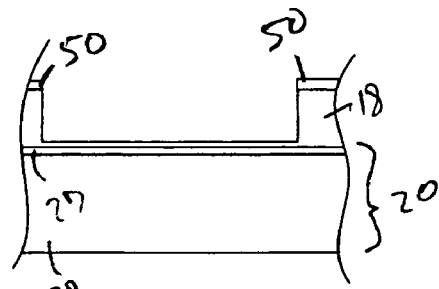
Figure 4C:
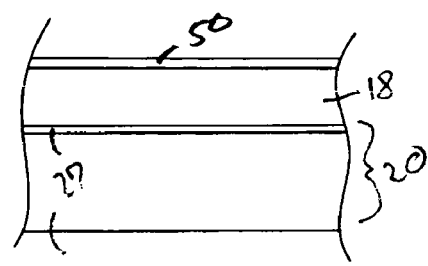

FIG. 4A through FIG. 4C illustrate a first mask 50 formed on the silicon-on-insulator wafer or chip to provide a device precursor. FIG. 4A is a topview of the device precursor. FIG. 4B is a cross-section of the device precursor shown in FIG. 4A taken along the line labeled B. FIG. 4C is a cross-section of the device precursor shown in FIG. 4A taken along the line labeled C. The first mask 50 leaves exposed a region of the device precursor where a sensor cavity 52 is to be formed while the remainder of the illustrated portion of the device precursor is protected. The sensor cavity 52 is the region of the device precursor where the light-absorbing medium 32 is to be formed. A first etch is then performed so as to form the sensor cavity 52. The first etch yields the device precursor of FIG. 4A through FIG. 4C. The first etch is performed such that the seed portion 34 of the light-transmitting medium 18 remains on the base 20. Accordingly, the first etch is terminated before the base 20 is reached.

A suitable first mask 50 includes, but is not limited to, a hard mask such as a silica mask. A suitable first etch includes, but is not limited to, a dry etch.

Figure 5A:
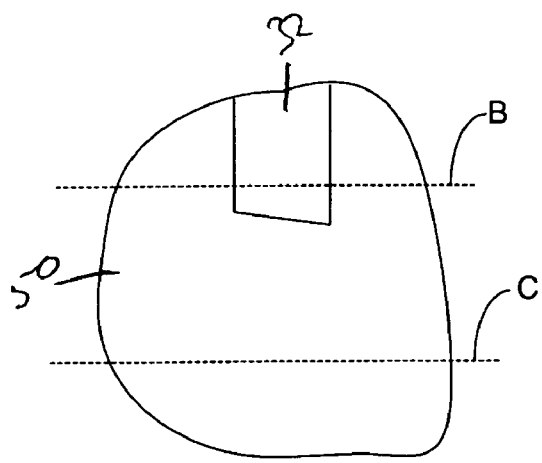
Figure 5B:
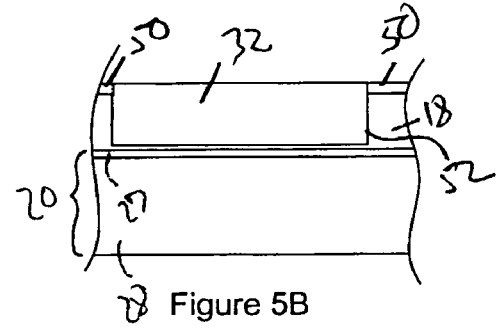
Figure 5C:
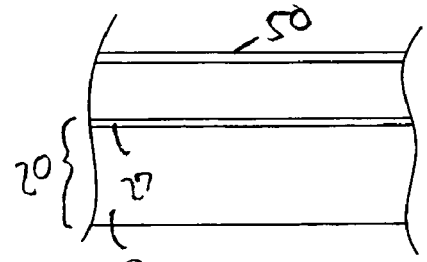

As shown in FIG. 5A through FIG. 5C, the light-absorbing medium 32 is formed in the sensor cavity 52 of FIG. 4A through FIG. 4C. FIG. 5A is a topview of the device precursor. FIG. 5B is a cross-section of the device precursor shown in FIG. 5A taken along the line labeled B. FIG. 5C is a cross-section of the device precursor shown in FIG. 5A taken along the line labeled C. When the light-transmitting medium 18 is silicon and the light-absorbing medium 32 is germanium, the germanium can be grown on the seed portion 34 of the silicon. After formation of the light light-absorbing medium 32, the device precursor can be planarized to provide the device precursor of FIG. 5A through FIG. 5C.

The first mask 50 can be removed from the device precursor of FIG. 5A through FIG. 5C and a second mask 54 can be formed on the device precursor so as to provide the device precursor of FIG. 6A through FIG. 6C. FIG. 6A is a topview of the device precursor. FIG. 6B is a cross-section of the device precursor shown in FIG. 6A taken along the line labeled B. FIG. 6C is a cross-section of the device precursor shown in FIG. 6A taken along the line labeled C. The second mask 54 is formed such that the regions where the trenches 24 are to be formed remain exposed while protecting the remainder of the illustrated portion of the device precursor. A suitable second mask 54 includes a hard mask such as a silica mask.

A second etch is performed on the device precursor of FIG. 6A through FIG. 6C to provide the device precursor of FIG. 7A through FIG. 7C. FIG. 7A is a topview of the device precursor. FIG. 7B is a cross-section of the device precursor shown in FIG. 7A taken along the line labeled B. FIG. 7C is a cross-section of the device precursor shown in FIG. 7A taken along the line labeled C. The second etch is stopped when the first portion of the etched material is etched to about the depth desired for the trenches 24. Since the second etch etches the light-transmitting medium 18 and the light-absorbing medium 32 concurrently, the second etch etches the light-transmitting medium 18 and the light-absorbing medium 32 to different depths. For instance, FIG. 7B illustrates the light-absorbing medium 32 etched deeper than the light-transmitting medium 18. A suitable second etch includes, but is not limited to, a dry etch that can etch both the light-transmitting medium 18 and the light-absorbing medium 32.

A third mask 56 is formed on the device precursor of FIG. 7A through FIG. 7C as shown by the device precursor of FIG. 8A through FIG. 8C. FIG. 8A is a topview of the device precursor. Although the location of the light-absorbing medium 32 is not visible from above the device precursor of FIG. 8A, the light-absorbing medium 32 is illustrated as a dashed line in order to show the spatial relationship between the third mask 56 and the underlying light-absorbing medium 32. FIG. 8B is a cross-section of the device precursor shown in FIG. 8A taken along the line labeled B. FIG. 8C is a cross-section of the device precursor shown in FIG. 8A taken along the line labeled C. Portions of the third mask 56 are formed over the second mask 54. The third mask 56 is formed such that the combination of the second mask 54 and the third mask 56 leave the trenches 24 associated with the waveguide 16 exposed while the remainder of the illustrated portion of the device precursor is protected. A third etch is then performed so as to provide the device precursor of FIG. 8A through FIG. 8C. The third etch is performed such that the trenches 24 associated with the waveguide 16 and the light sensor are etched to about the same depth. As a result, the third etch corrects for the depth differential that is evident in FIG. 7B and FIG. 7C.

A suitable third mask 56 includes, but is not limited to, a photoresist. A suitable third etch includes, but is not limited to, a dry etch.

The third mask 56 is removed and doped regions 40, 42 are formed in the light-transmitting medium 18 and in the light-absorbing medium 32 so as to provide the device precursor of FIG. 9A through FIG. 9C. FIG. 9A is a topview of the device precursor. FIG. 9B is a cross-section of the device precursor shown in FIG. 9A taken along the line labeled B. FIG. 9C is a cross-section of the device precursor shown in FIG. 9A taken along the line labeled C. The n-type doped regions can be generated by forming a doping mask on the device precursor so the locations of the n-type doped regions are exposed and the remainder of the illustrated portion of the device precursor is protected. High angle dopant implant processes can be employed to form the n-type doped regions. The doping mask can then be removed. The same sequence can then be employed to form the p-type doped regions. The p-type doped regions can be formed before the n-type doped regions or the n-type doped regions can be formed before the p-type doped regions.

Figure 10A:
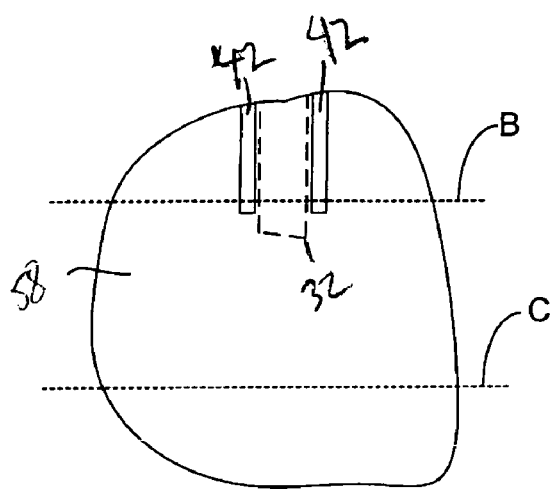
Figure 10B:
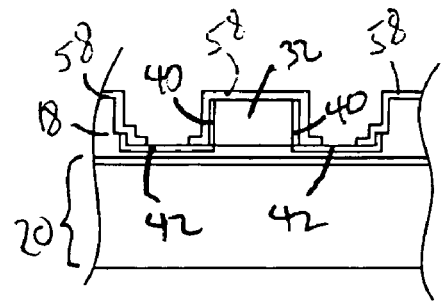
Figure 10C:
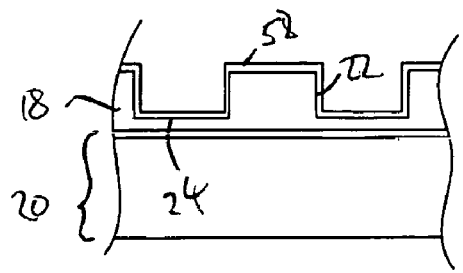

The second mask 54 is removed from the device precursor of FIG. 9A through FIG. 9C and a first cladding 58 is formed on the device precursor so as to provide the device precursor of FIG. 10A through FIG. 10C. FIG. 10A is a topview of the device precursor. Although the location of the light-absorbing medium 32 is not visible from above the device precursor of FIG. 10A, the light-absorbing medium 32 is illustrated as a dashed line in order to show the spatial relationship between features on the device precursor. FIG. 10B is a cross-section of the device precursor shown in FIG. 10A taken along the line labeled B. FIG. 10C is a cross-section of the device precursor shown in FIG. 10A taken along the line labeled C. As is evident in FIG. 10A and FIG. 10B, the first cladding 58 is formed such that the portion of the doped regions 42 that are to be contacted by the electrical conductors 44 remain exposed and the remainder of the illustrated portion of the device precursor are protected by the first cladding 58. A suitable first cladding 58 includes, but is not limited to, PECVD deposited silica that is subsequently patterned using photolithography.

Figure 11A:
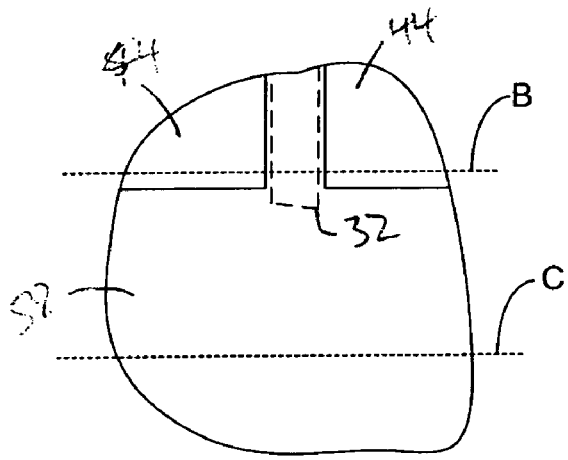
Figure 11B:
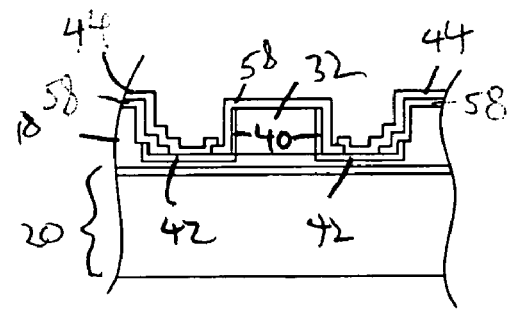
Figure 11C:
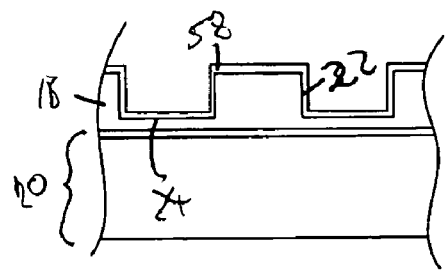

The electrical conductors 44 are formed on the device precursor of FIG. 10A and FIG. 10C so as to provide the device precursor of FIG. 1A through FIG. 11C. FIG. 11A is a topview of the device precursor. Although the location of the light-absorbing medium 32 is not visible from above the device precursor of FIG. 11A, the light-absorbing medium 32 is illustrated as a dashed line in order to show the spatial relationship between features on the device precursor. FIG. 11B is a cross-section of the device precursor shown in FIG. 11A taken along the line labeled B. FIG. 11C is a cross-section of the device precursor shown in FIG. 11A taken along the line labeled C. As is evident in FIG. 11A and FIG. 11B, the electrical conductors 44 can be formed so each electrical conductor 44 extend from one of the doped regions 42, out of the trench 24, and over the light-transmitting medium 18. Suitable electrical conductors 44 include metals such as titanium and aluminum. The metals can be deposited by sputtering and patterned by photolithography.

Figure 12B:
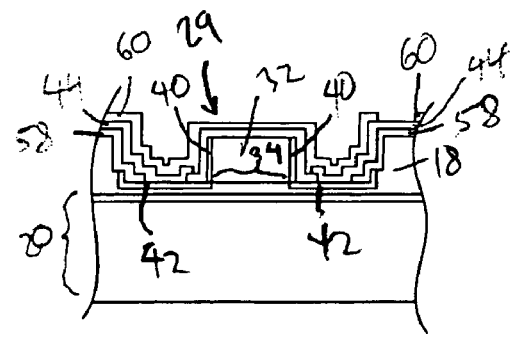
Figure 12A:
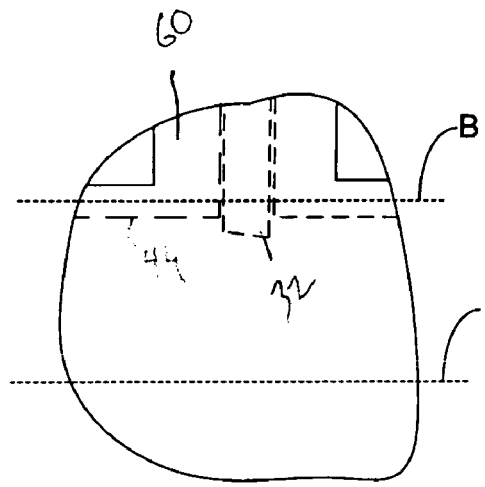
Figure 12C:
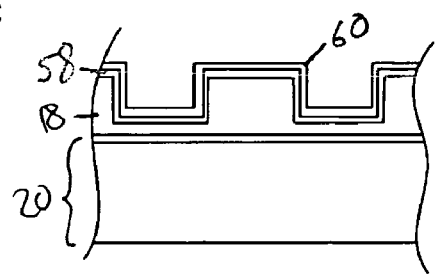

A second cladding 60 can optionally be formed on the device precursor of FIG. 11A through FIG. 11C so as to provide the device precursor of FIG. 12A through FIG. 12C. FIG. 12A is a topview of the device precursor. Although the location of the light-absorbing medium 32 and the electrical conductors 44 are not visible from above the device precursor of FIG. 12A, the light-absorbing medium 32 and electrical conductors 44 is illustrated by dashed lines in order to show the spatial relationship between features on the device precursor. FIG. 12B is a cross-section of the device precursor shown in FIG. 12A taken along the line labeled B. FIG. 12C is a cross-section of the device precursor shown in FIG. 12A taken along the line labeled C. As is evident in FIG. 12A and FIG. 12B, the second cladding 60 can be patterned such that the second cladding 60 defines contact pads the electrical conductors 44. A suitable second cladding 60 includes, but is not limited to, PECVD deposited SiN that is subsequently patterned using photolithography. After removing photoresists formed during photolithography, the device precursor of FIG. 12A through FIG. 12C can be sintered to form the optical device.

The device can be used in conjunction with electronics that are in electrical communication with the contact pads. The electronics can apply electrical energy to the contact pads so as to form a reverse bias across the PIN junction in the light sensor. When the light-absorbing medium 32 receives a light signal, an electrical current flows through the light-absorbing medium 32 indicating the receipt of the light signal.

FIG. 13A through FIG. 16B illustrate a method of generating an optical device constructed according to FIG. 2B. The method is illustrated using the device precursor of FIG. 5A through FIG. 5C as the starting device precursor.

Figure 13A:
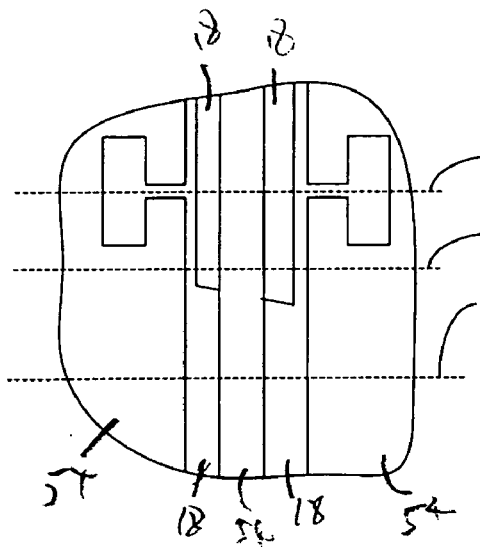
FIG. 13A through FIG. 16B illustrate a method of generating an optical device constructed according to FIG. 2B.
Figure 13C:
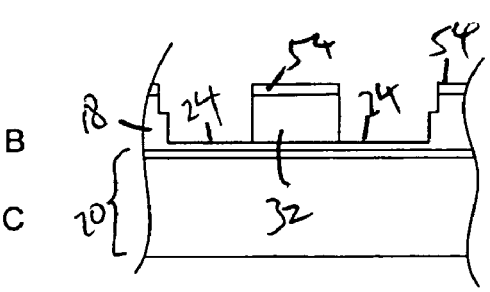
Figure 13D:
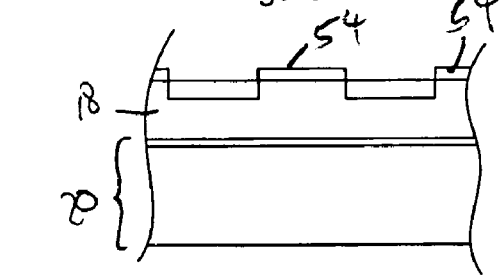
Figure 13B:
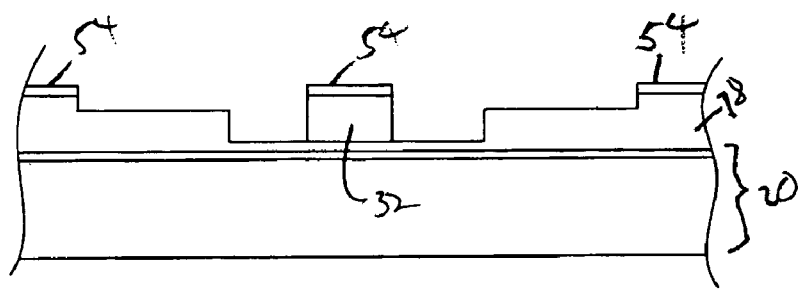

The first mask 50 can be removed from the device precursor of FIG. 5A through FIG. 5C and a second mask 54 can be formed on the device precursor as shown in FIG. 13A through FIG. 13C. FIG. 13A is a topview of the device precursor. FIG. 13B is a cross-section of the device precursor shown in FIG. 13A taken along the line labeled B. FIG. 13C is a cross-section of the device precursor shown in FIG. 13A taken along the line labeled C. FIG. 13D is a cross-section of the device precursor shown in FIG. 13A taken along the line labeled D. The second mask 54 is formed such that the regions where trenches 24 are to be formed remain exposed. The second mask 54 also leaves exposed contact regions where electrical contact pads will be formed. The second mask 54 protects the remainder of the illustrated portion of the device precursor. A suitable second mask 54 includes a hard mask such as a silica mask.

A second etch is performed on the device precursor so as to provide the device precursor of FIG. 13A through FIG. 13C. The second etch is stopped where the first portion of the etched material is etched to the depth desired for the trenches 24. Since the second etch etches the light-transmitting medium 18 and the light-absorbing medium 32 concurrently, the second etch etches the light-transmitting medium 18 and the light-absorbing medium 32 to different depths. For instance, FIG. 13B illustrates the light-absorbing medium 32 etched deeper than the light-transmitting medium 18. A suitable second etch includes, but is not limited to, a dry etch that can etch both the light-transmitting medium 18 and the light-absorbing medium 32.

Figure 14A:
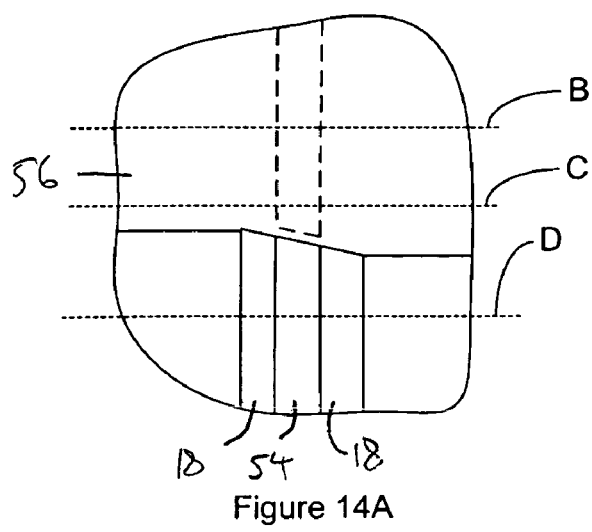
Figure 14C:
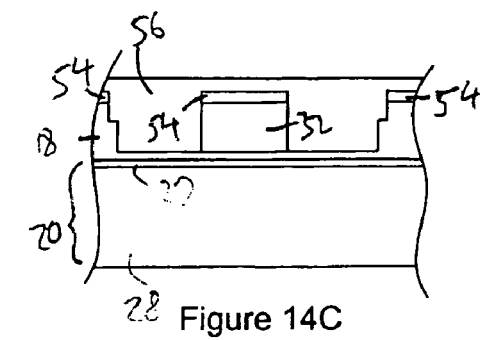
Figure 14D:
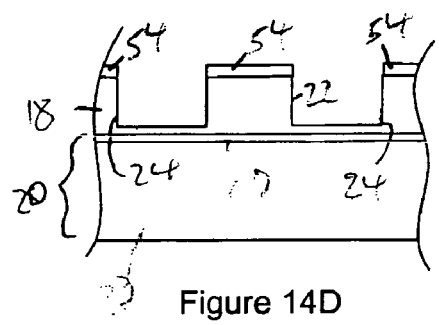
Figure 14B:
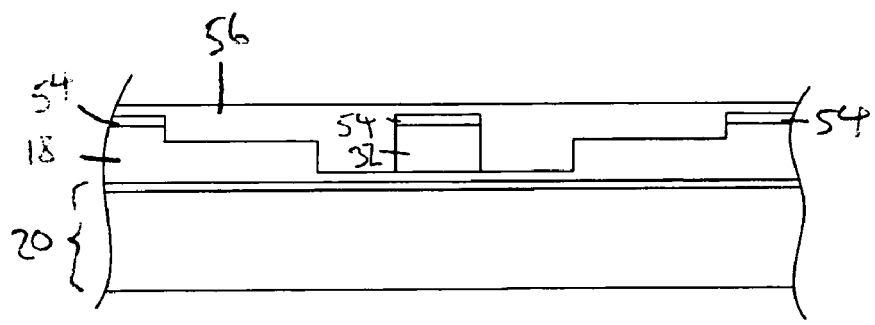

A third mask 56 is formed on the device precursor of FIG. 13A through FIG. 13D as shown by the device precursor of FIG. 14A through FIG. 14D. FIG. 14A is a topview of the device precursor. Although the location of the light-absorbing medium 32 is not visible from above the device precursor of FIG. 14A, the light-absorbing medium 32 is illustrated as a dashed line in order to show the spatial relationship between the third mask 56 and the underlying light-absorbing medium 32. FIG. 14B is a cross-section of the device precursor shown in FIG. 14A taken along the line labeled B. FIG. 14C is a cross-section of the device precursor shown in FIG. 14A taken along the line labeled C. FIG. 14D is a cross-section of the device precursor shown in FIG. 14A taken along the line labeled D. The third mask 56 is formed such that the combination of the second mask 54 and the third mask 56 leave the trenches 24 associated with the waveguide 16 exposed while the remainder of the illustrated portion of the device precursor is protected. A third etch is then performed so as to provide the device precursor of FIG. 14A through FIG. 14D. The third etch is performed such that the trenches 24 associated with the waveguide 16 and the light sensor are etched to about the same depth. As a result, the third etch corrects for the depth differential that is evident in FIG. 13C and FIG. 13D.

Figure 15A:
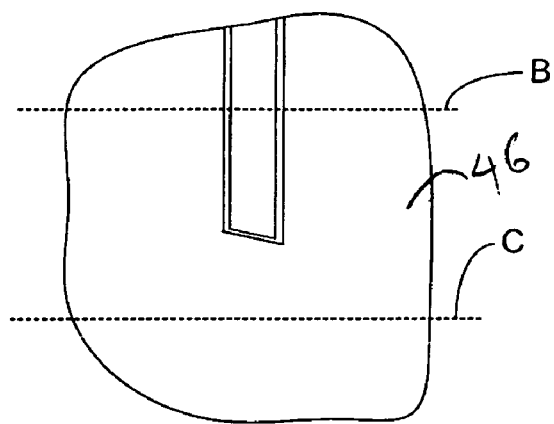
Figure 15C:
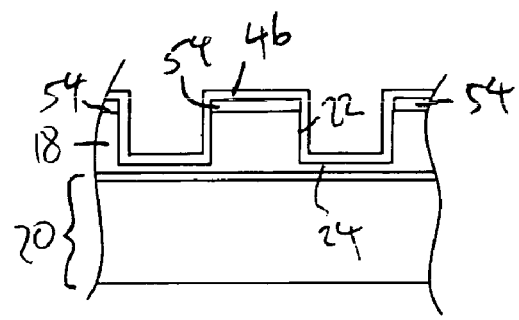
Figure 15B:
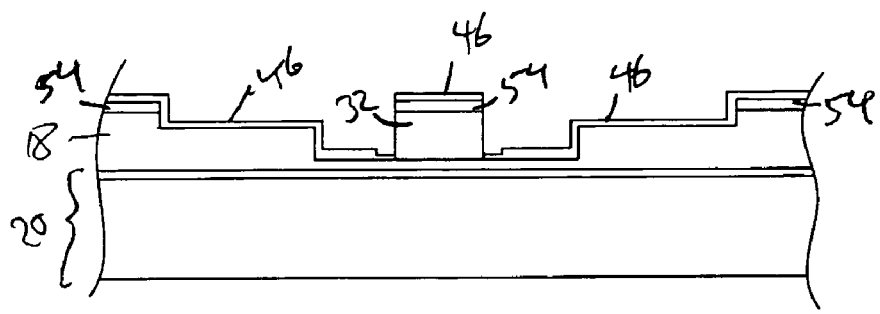

The third mask 56 is removed from the device precursor of FIG. 14A through FIG. 14D. A spacer layer 46 is formed on the result as shown FIG. 15A through FIG. 15C. FIG. 15A is a topview of the device precursor. FIG. 15B is a cross-section of the device precursor shown in FIG. 15A taken along the line labeled B. FIG. 15C is a cross-section of the device precursor shown in FIG. 15A taken along the line labeled C. Suitable materials for the spacer layer 46 include, but are not limited to, PECVD deposited silica that is subsequently patterned using photolithography with a wet etch.

Figure 16B:
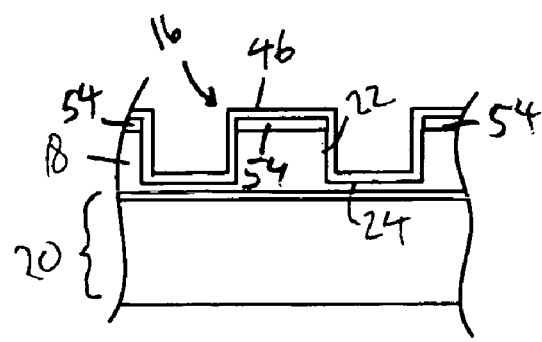
Figure 16A:
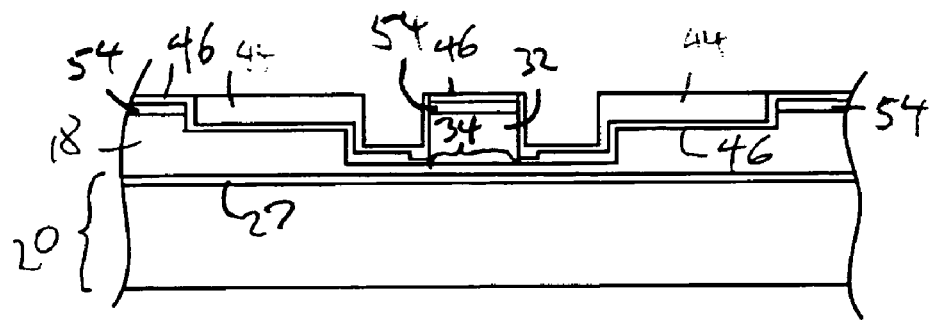

The electrical conductors 44 are formed on the device precursor of FIG. 15A through FIG. 15C as shown in FIG. 16A and FIG. 16B. FIG. 16A and FIG. 16B are each cross sections of the device precursor. As is evident in FIG. 16A and FIG. 16B, the electrical conductors 44 can be formed so each electrical conductor 44 extends from the spacer layer 46 to the top of a lateral side. Each electrical conductor 44 also extends out of the trenches 24 and into the contact regions. Suitable electrical conductors 44 include metals such as titanium and aluminum. The metals can be deposited by sputtering and patterned by photolithography.

Cladding layers and contact pads can be formed on the device precursor of FIG. 16A and FIG. 16 as discussed in connection with FIG. 12A through FIG. 12C. The resulting contact pads can be used in conjunction with electronics as disclosed above.

The method of FIG. 13A through 16B can be adapted to forming the device of FIG. 2A. For instance, the second etch and the third etch can be performed down to the level of the base 20 and the rest of the method executed without forming the spacer layer 46.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
a waveguide on a base, the waveguide configured to guide a light signal through a light-transmitting medium; and
a light sensor positioned on the base,
the light sensor including a light-absorbing medium having lateral sides that each extends between a top side and a bottom side, the bottom side being between the base and the top side,
the light-absorbing medium configured to receive at least a portion of the light signal from the light-transmitting medium in the waveguide,
the light-transmitting medium and the light-absorbing medium being different materials,
field sources configured to serve as sources of an electrical field in the light-absorbing medium,
the field sources each contacting one of the lateral sides and the lateral sides that are contacted by the field sources being on opposing sides of the light-absorbing medium.

2. The device of claim 1, wherein each of the lateral sides contacted by one of the field sources is perpendicular to the base.

3. The device of claim 1, wherein the light-transmitting medium and the light-absorbing medium contact one another at an interface, the interface being configured such that the light signal travels through the interface, the interface being at a non-perpendicular angle relative to a direction of propagation of the light signals through the waveguide at the interface.

4. The device of claim 3, wherein the angle is between 80° and 85°.

5. The device of claim 1, wherein a seed portion of the light-transmitting medium is positioned between the light-absorbing medium and the base, and
the light-absorbing medium contacts the seed portion of the light-transmitting medium.

6. The device of claim 1, wherein the field sources are each a doped region of the light-absorbing medium.

7. The device of claim 1, wherein the field sources are each a metal.

8. The device of claim 7, wherein a seed portion of the light-transmitting medium is positioned between the light-absorbing medium and the base,
the light-absorbing medium contacts the seed portion of the light-transmitting medium, and
each field source is positioned such that a lowest part of the metal included in the field source is above the seed portion of the light-transmitting medium.

9. The device of claim 1, wherein each of the field sources spans a distance between a top of the lateral side contacted by the field source and the bottom of the lateral side contacted by the field source.

10. The device of claim 1, wherein each of the field sources extends from a top of the lateral side contacted by the field source toward the base.

11. The device of claim 1, wherein each of the field sources extends toward the base from a location that is above 90% of a distance between a top of the lateral side contacted by the field source and the bottom of the lateral side contacted by the field source.

12. The device of claim 1, wherein each of the field sources extends toward the base from a location that is within 1 µm of a top of the lateral side.

13. The device of claim 1, wherein the waveguide includes a horizontal taper positioned such that the waveguide travels directly from the taper to the light sensor.

14. An optical device, comprising:
a waveguide on a base, the waveguide configured to guide a light signal through a light-transmitting medium; and
a light sensor positioned on the base, the light sensor including a light-absorbing medium having lateral sides that each extends between a top side and a bottom side, the bottom side being between the base and the top side, a seed portion of the light-transmitting medium being between the light-absorbing medium and the base, the light-absorbing medium configured to receive at least a portion of the light signal from the light-transmitting medium in the waveguide, the light-transmitting medium and the light-absorbing medium being different materials, field sources configured to serve as sources of an electrical field in the light-absorbing medium, the field sources each contacting one of the lateral sides and the lateral sides that are contacted by the field sources being on opposing sides of the light-absorbing medium, and each of the lateral sides that is contacted by one of the field sources being perpendicular to the base.

15. The device of claim 14, wherein the field sources are each a doped region of the light-absorbing medium.

16. The device of claim 1, wherein the field sources are each a metal.

17. The device of claim 16, wherein the light-absorbing medium contacts the seed portion of the light-transmitting medium, and each field source is positioned such that a lowest part of the metal included in the field source is above the seed portion of the light-transmitting medium.

18. The device of claim 14, wherein each of the field sources spans a distance between a top of the lateral side contacted by the field source and the bottom of the lateral side contacted by the field source.

19. The device of claim 14, wherein each of the field sources extends from a top of the lateral side contacted by the field source toward the base.

20. The device of claim 14, wherein each of the field sources extends toward the base from a location that is above 90% of a distance between a top of the lateral side contacted by the field source and the bottom of the lateral side contacted by the field source.

* * * * *

UNITED STATES PATENT AND TRADEMARK OFFICE
CERTIFICATE OF CORRECTION

PATENT NO. : 8,053,790 B2  
APPLICATION NO. : 12/380016  
DATED : November 8, 2011  
INVENTOR(S) : Feng et al.

It is certified that error appears in the above-identified patent and that said Letters Patent is hereby corrected as shown below:

In Column 1, immediately below the Title, please insert the following:
--This invention was made with Government support under Agreement No. HR0011-08-9-0001 awarded by DARPA. The Government has certain rights in this invention.--

Signed and Sealed this  
Twenty-fourth Day of April, 2012

David J. Kappos  
*Director of the United States Patent and Trademark Office*